Figure 1:
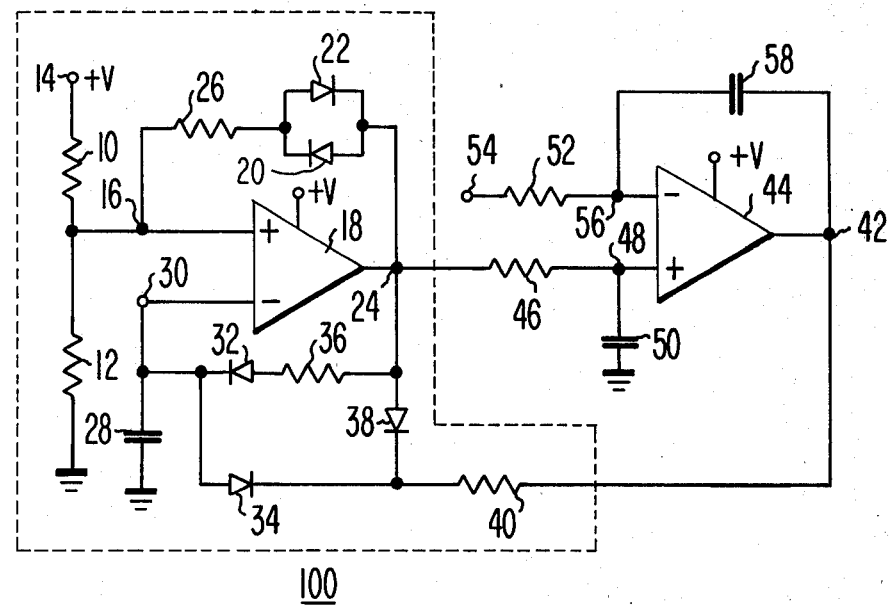

United States Patent [19]
Wittlinger

[11] 3,996,531
[45] Dec. 7, 1976

[54] OSCILLATOR CIRCUIT WHOSE FREQUENCY IS VOLTAGE CONTROLLABLE WHICH CONTAINS A COMPARATOR

[75] Inventor: Harold Allen Wittlinger, Pennington, N.J.

[73] Assignee: RCA Corporation, New York, N.Y.

[22] Filed: Dec. 18, 1975

[21] Appl. No.: 642,241

[30]    Foreign Application Priority Data

Feb. 17, 1975    United Kingdom ............ 06618/75

[52] U.S. Cl. ............................. 331/143; 331/177 R
[51] Int. Cl.² ......................................... H03K 3/02
[58] Field of Search .......... 331/111, 113 R, 108 D, 331/135, 136, 143, 177 R

[56]          References Cited
          UNITED STATES PATENTS 3,916,342    10/1975    Higuchi et al. .................... 331/111

OTHER PUBLICATIONS

Cantoni, "Astable Multivibrator with Independent Mark-and Space-Time Control," Electronics Letters, Apr. 5, 1973, vol. 9, p. 158.

*Primary Examiner*—Siegfried H. Grimm
*Attorney, Agent, or Firm*—H. Christoffersen; S. Cohen; F. R. Perillo

[57]           ABSTRACT

An oscillator utilizing a voltage comparator having hysteresis characteristics for producing a pulse train. The width of the pulses in the train is controlled by the charging rate of a capacitor coupled to one input of the comparator and the period of the pulse train is controlled by the discharge rate of this capacitor. The discharge rate and hence the oscillator frequency may be varied in response to a control voltage. Compensating elements ensure that the pulse width is highly stable with respect to temperature variations. The oscillator when in a feedback control circuit, produces oscillations at a frequency whose value is linearly related to the feedback control voltage.

9 Claims, 2 Drawing Figures

OSCILLATOR CIRCUIT WHOSE FREQUENCY IS VOLTAGE CONTROLLABLE WHICH CONTAINS A COMPARATOR

This invention relates to free-running pulse generators and, in particular, to pulse generators whose frequency of oscillation may be varied in response to a control voltage.

There is a need in the art for simple voltage controlled oscillators whose frequency and pulse width easily may be controlled and which are highly stable with respect, for example, to temperature variations. Typical uses for such circuits are in analog-to-digital converters, digital voltmeters and telemetry systems. The oscillator of the present application was designed to meet this need.

Figure 2:
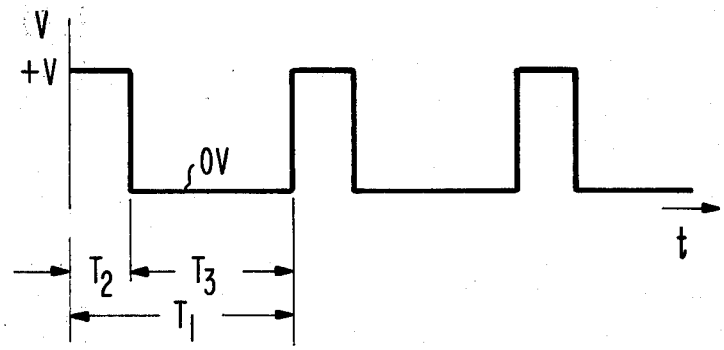

In the drawings:

FIG. 1 is a schematic circuit diagram of a preferred embodiment of the invention; and FIG. 2 shows a waveform present in the circuit of FIG. 1.

In the circuit of FIG. 1 resistors 10 and 12 are serially connected between terminal 14, to which an operating voltage +V may be applied, and a reference potential, herein ground. The common connection of resistors 10 and 12 is connected to the non-inverting input terminal 16 of operational amplifier 18. Connected to output terminal 24 of amplifier 18 are the cathode and the anode of diodes 22 and 20, respectively. Resistor 26 is connected between terminal 16 and the common connection of the cathode of diode 20 and the anode of diode 22. Capacitor 28 is connected between the inverting input terminal 30 of amplifier 18 and ground. Also connected to terminal 30 are the cathode of diode 32 and the anode of diode 34. The anode of diode 32 is connected through resistor 36 to output terminal 24. The anode of diode 38 is connected to output terminal 24 while its cathode is connected to the cathode of diode 34. The common connection of the cathodes of diodes 34 and 38 is connected through resistor 40 to output terminal 42 of amplifier 44. Resistor 46 is connected between output terminal 24 of amplifier 18 and the non-inverting input terminal 48 of amplifier 44. Capacitor 50 is connected between terminal 48 and the reference potential. Resistor 52 is connected between terminal 54, to which a control voltage may be applied, and inverting input terminal 56 of amplifier 44. Capacitor 58 is connected between terminals 56 and 42 of amplifier 44.

In the operation of the circuit of FIG. 1, voltage controlled oscillator (VCO) 100, shown within the dashed lines, is part of a closed loop frequency control system. Assume initially that the system is oscillating at a constant frequency. That is, a fixed control voltage has been applied to terminal 54 and a sufficient amount of time has elapsed for the circuit to reach an equilibrium condition. Considering first the operation of VCO 100, amplifier 18 functions as a voltage comparator having hysteresis characteristics. When the voltage at terminal 30 is less than the voltage at terminal 16, the amplifier is in its high state, that is, its output voltage is at or near the amplifier supply voltage level +V. When the voltage at terminal 30 is slightly greater than the voltage at terminal 16, the amplifier is in its low state, that is, its output voltage is at or near the reference potential (ground).

The voltage present at terminal 16 depends upon the state of amplifier 18. Assume that the amplifier 18 has just switched to its high state. For this output condition, the same voltage +V appears at node 24 and terminal 14 so that resistors 26 and 10 are essentially in parallel. The voltage at terminal 16 of amplifier 18 is determined by the voltage divider comprising resistor 12 and the parallel combination of resistors 10 and 26. If, by way of example, these three resistors are of equal resistance value, then the voltage at terminal 16 equals ⅔ of the voltage present at terminal 14. The voltage drop across diodes 20 and 22 may be neglected for the time being.

With the amplifier 18 in its high state, a charging path exists for capacitor 28 through resistors 36 and diode 32. At the same time, diode 38 is forward biased which, in turn, back biases diode 34 and disconnects resistor 40 from the charging path of capacitor 28. Capacitor 28 charges towards the voltage +V present at terminal 24 at a rate determined primarily by the values of resistor 36 and capacitor 28.

Disconnecting resistor 40 during the charging period of capacitor 28 and, as will be shown shortly, disconnecting resistor 36 during its discharging period, ensures that charging and discharging paths for capacitor 28 are separate. As a result, neither the value of resistor 40 nor the voltage across this resistor has any effect on the charging rate of the capacitor or on the width of the pulse produced thereby. Similarly, the resistor 36 does not affect the discharge rate of the capacitor.

When the voltage at amplifier input terminal 30 become slightly larger than the voltage present at terminal 16, amplifier 18 switches to its low state, that is the node 24 voltage switches from +V to a value at or near ground level. This causes the voltage at terminal 16 of amplifier 18 to change to a less positive value. Resistors 12 and 26 are now essentially in parallel and making the same assumption as before, that is, 10, 12 and 26 of the same value, the voltage at terminal 16 switches from +2V/3 to +V/3. Diode 38 is no longer conductive and diode 34 is no longer back biased. Therefore, capacitor 28 starts to discharge through the paths comprising diode 34 and resistor 40 toward the voltage present at terminal 42. The voltage at 42 is a function of the control voltage at 54 and the oscillator 100 frequency as will be explained shortly. Diode 32 is back biased during the discharge period of capacitor 28. The discharge rate of the capacitor is determined primarily by the values of capacitor 28 and resistor 40 and the voltage present at output terminal 42 of amplifier 44. The voltage across resistor 40, which equals the voltage across capacitor 28 minus the voltage at terminal 42, divided by its resistance determines the discharge current of capacitor 28.

The discharge of capacitor 28 continues until the voltage at terminal 30 is slightly less than the voltage at terminal 16 at which point the amplifier 18 will switch once more into its high state thereby initiating the next cycle of oscillation.

FIG. 2 shows the voltage present at terminal 24. The period of a cycle of oscillation is shown as time $T_1$. The high output condition which is also the charging time of capacitor 28 is shown as the time interval $T_2$ while the discharge time of capacitor 28, which represents a low output condition of amplifier 18, is represented by time $T_3$.

Consider now the remaining elements in the circuit. The oscillator output at terminal 24 is applied to the integrator comprising resistor 46 and capacitor 50. The integrator functions as a frequency-to-voltage converter. Its output voltage, which is applied to the noninverting terminal 48 of amplifier 44, is proportional to the frequency of the voltage at terminal 24. If it is desired to increase the frequency of oscillation, the voltage at terminal 54 is increased. As a result, the output voltage at amplifier 44 decreases, causing an increased voltage drop across resistor 40 during the discharge intervals of capacitor 28. Since, as discussed earlier, the discharge current of this capacitor is a function of the voltage across resistor 40, the effect of this greater voltage drop is that this capacitor will discharge in less time than that required for the previously described cycle of operation. As a result, the time shown as $T_3$ in FIG. 2 will be shorter, resulting in an overall increase in frequency of oscillation.

If it is desired to increase the frequency of oscillation, the voltage at terminal 54 is reduced which in turn causes an increase in the voltage present at node 42. Because of the smaller potential difference across resistor 40, the discharge of capacitor 28 is slower, thereby increasing the time shown as $T_3$ in FIG. 2, resulting in an overall decrease in oscillator frequency.

When the voltage at terminal 54 is increased, the voltage at terminal 48 of amplifier 44, which represents the integrated oscillator output, also increases as the oscillator frequency increases. This latter voltage increases until the proper error voltage difference exists between terminals 48 and 56 to maintain the oscillator frequency at its new constant value. Resistor 52 and capacitor 58 form an integrator at the inverting input terminal of amplifier 44. The purpose of this integrator is two-fold. First, it serves to limit the bandwidth of amplifier 44 thereby limiting the amount of noise appearing at its output. Secondly, the additional integration ensures that the voltage at the output of amplifier 44 will not follow slight variations in the voltage level present at terminal 48 as the integration of the oscillator output signal occurs. A circuit has been thus described in which the frequency of oscillation is controlled by varying the potential across resistor 40. By utilizing a high gain operational amplifier for determining when the desired frequency has been attained, a highly linear relationship between control voltage and frequency response has been attained.

While the frequency of oscillation could be controlled by eliminating amplifier 44 and applying the control voltage directly to the end of resistor 40 connected to terminal 42, there would then be a nonlinear relationship between the control voltage and the oscillator frequency.

Viewing the operation of the complete circuit of FIG. 1 as a control system, the gain of the circuit may be expressed as $E_o/E_{IN} = G/(1+G)$, where $E_o$ is the voltage at input terminal 48 of amplifier 44, $E_{IN}$ is the control voltage at terminal 54, and $G$ is the overall forward gain of the control loop. This gain term includes the gain of amplifiers 18 and 44 as well as the integrator comprising resistor 46 and capacitor 50.

When the gain is very large, as is the case in the circuit illustrated, the value of $E_o/E_{IN}$ approaches 1 or $E_o \simeq E_{IN}$. This is not to suggest that in the present circuit the output voltage equals the input voltage. Such a result arises in the present example because a unity feedback system was arbitrarily assumed for purposes of illustration. Where a feedback factor K is involved, $E_o/E_{IN} \simeq 1/K$ for large values of gain. The point to note is that the output voltage is a highly linear function of the input voltage and the output voltage is a linear function of frequency.

An additional feature of the circuit of FIG. 1 is its pulse width stability with respect to temperature variations. Diodes 32 and 34 are necessary to insure that capacitor 28 has separate and distinct charging and discharging paths. Each of these diodes has a temperature coefficient which in the presence of temperature variations could vary the voltage present at terminal 30 and could thus affect the switching point of amplifier 18. The variations in the forward voltage drop across diode 34 caused by temperature changes will not affect the frequency oscillation when the VCO is part of a feedback stabilized circuit. This diode is part of the control circuitry that determines the time shown as $T_3$ in FIG. 2. Since this time is stabilized by the feedback system of FIG. 1 which includes amplifier 44, time $T_3$ is not dependent on the particular voltage drop across diode 34. It is for time $T_2$ that temperature compensation is required, because this interval is not stabilized by the feedback loop. The effects of voltage variations across diode 32 are compensated for by the addition of diode 20. Thus the voltages at terminals 16 and 30 tend to track each other with respect to temperature variations. Diode 22 is present only to provide a bilateral current path between terminals 16 and 24. However, it should be noted that if VCO 100 is used in an open-loop configuration, then temperature compensation for the effects of diode 34 is provided by diode 22. For purposes of circuit simplification, diode 38 may be eliminated and diode 34 may be replaced by a short circuit and the circuit of FIG. 1 will still operate in a manner similar to that already described. However, with the circuit so modified, the value of the pulse width shown as $T_2$ in FIG. 2 would tend to vary as a function of the control signal present at output terminal 42 of amplifier 44. This may be undesirable in many applications where a highly stable, precisely determined pulse width is desired.

The circuit of FIG. 1 was constructed utilizing components having the following representative values. Amplifiers 18 and 44 are commercially available CA3130 operational amplifiers manufactured by RCA Corporation. Resistors 10, 12, 26 each have a value of 100,000 ohms. Resistors 52 and 46 are each one megohm while capacitors 50 and 58 each have a value of 0.01 microfarads. Resistor 40 has a value of 3,000 ohms while capacitor 28 has a value of 500 picofarads. Resistor 36 may be two elements; a fixed resistor having a value of 180K ohms and a variable resistor having a range of zero to 10,000 ohms. Calibration consisted of setting the value of resistor 36 such that time $T_2 = 66.666$ microseconds, which yielded an overall oscillator frequency of 10,000 Hertz when 10 volts is present at terminal 54. The input voltage at terminal 54 is reduced to 10 millivolts, and the offset voltage of amplifier 42 is adjusted (offset adjust means not shown) for an output frequency of 10 Hertz.

It should be appreciated that the use of VCO 100 is not limited to the configuration shown in FIG. 1. This oscillator may be used in virtually any application where a voltage pulse train whose frequency is determined by a control voltage is desired.

What is claimed is:
1. An oscillator circuit comprising, in combination: a voltage comparator having first and second voltage input terminals and an output terminal for produc- ing an output voltage at a first level when the voltage at said second input terminal is greater than at said first input terminal and a second level otherwise;

means responsive to said output voltage for applying a feedback voltage to said second input terminal which is of a first value when said output voltage is at said first level and of a second value when said output voltage is at said second level;

charge storage means coupled between said first input terminal and a point at a reference potential;

a charging circuit coupled between said comparator output terminal and said first input terminal including means responsive to said output voltage when at its first level for closing said circuit thereby permitting said charge storage means to charge, and responsive to said output voltage when at its second level for opening said charging circuit;

a control terminal to which a control voltage source may be applied;

a discharging circuit separate from said charging circuit coupled between said first input terminal and said control terminal; and means responsive to said output voltage for closing said discharging circuit when said output voltage is at said second level and for opening said discharging circuit when said output voltage is at said first level.

2. The combination as set forth in claim 1 wherein the means for closing and opening said discharging circuit comprises, in combination:
   a first diode poled in a direction enabling the discharge of said charge storge means, serially connected in said discharging path, said first diode connected at one electrode to said first input terminal; and
   a second diode connected between said output terminal and the other electrode of said first diode, said second diode poled to be forward biased whenever said output voltage is at its first level, thereby reverse biasing said first diode, and reverse biased otherwise.

3. The combination as set forth in claim 1 wherein the means for closing and opening said charging circuit comprises a diode poled in a direction such that said diode is forward biased whenever said output voltage is at its first level and reverse biased otherwise.

4. The combination as set forth in claim 1 wherein said means for applying a feedback voltage comprises, in combination:
   first and second resistances serially connected between an operating voltage and a point at said reference potential, the common connection of said resistors being connected to said second input terminal;
   a feedback path comprising a third resistance connected between said output and said second input terminals.

5. The combination as set forth in claim 4 wherein said feedback path further includes fourth and fifth diodes, said diodes poled in opposite directions to each other and connected in parallel combination, said parallel combination connected in series combination with said third resistance.

6. The combination as set forth in claim 1 wherein said control voltage source comprises, in combination:
   an amplifier having first and second input terminals, the first amplifier input terminal coupled to a voltage source, and an output terminal connected to said control terminal, said amplifier output voltage proportional to the difference between the voltages applied to said first and second amplifier input terminals; and
   means connected between said comparator output terminal and said second amplifier input terminal for producing a voltage having an amplitude substantially porportional to the frequency of operation of said oscillator.

7. The combination as set forth in claim 6 wherein said means for producing a voltage comprises a voltage integrator circuit.

8. In an oscillator circuit for producing a periodic waveform having a pulse width and an interpulse period and in which said oscillator includes a comparator circuit having first and second input terminals and an output terminal, means responsive to the output voltage level of said comparator for applying a voltage to said first terminal, charge storage means coupled between said second input terminal, and a point at a reference potential, means for charging said charge storage means towards a first potential through a path comprising a first impedance and means for discharging said charge storage means towards a second potential through a path comprising a second impedance, and wherein the pulse width is determined by the charging rate of said charge storage means and the interpulse period is determined by the discharge rate of said charge storage means, the improvement comprising:
   a control terminal, said terminal coupled to said charge storage means through said path comprising said second impedance; and
   means coupled to said control terminal producing said second potential, said means including means for varying said potential over a given range for controlling said discharge rate over a particular range and consequently said interpulse period.

9. The combination as set forth in claim 8 wherein said means coupled to said control terminal comprises, in combination:
   an amplifier having first and second input terminals, the first amplifier input terminal coupled to a voltage source, and an output terminal connected to said control terminal, said amplifier output voltage proportional to the difference between the voltages applied to said first and second amplifier input terminals; and
   means connected between said comparator output terminal and said second amplifier input terminal for producing a voltage having an amplitude substantially proportional to the frequency of said oscillator.

* * * * *

UNITED STATES PATENT OFFICE
CERTIFICATE OF CORRECTION

PATENT NO. : 3,996,531
DATED : December 7, 1976
INVENTOR(S) : Harold Allen Wittlinger It is certified that error appears in the above-identified patent and that said Letters Patent are hereby corrected as shown below:

Column 2, line 15, "resistors" should read --resistor--
Column 2, line 32, "come" should read --comes--
Column 3, line 18, "increase" should read --decrease--
Column 6, line 16, "porportional" should read --proportional--

Signed and Sealed this

Nineteenth Day of April 1977

[SEAL]

Attest:

RUTH C. MASON
Attesting Officer

C. MARSHALL DANN
Commissioner of Patents and Trademarks